United States Patent
Hsu et al.

(10) Patent No.: US 6,822,286 B2
(45) Date of Patent: Nov. 23, 2004

(54) CMOS-COMPATIBLE READ ONLY MEMORY AND METHOD FOR FABRICATING THE SAME

(75) Inventors: Ching-Hsiang Hsu, Hsin-Chu (TW); Wei-Zhe Wong, Tai-Nan (TW); Shih-Jye Shen, Hsin-Chu (TW); Hsin-Ming Chen, Tainan Hsien (TW); Shih-Chan Huang, Taipei Hsien (TW); Ming-Chou Ho, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 89 days.

(21) Appl. No.: 10/249,370

(22) Filed: Apr. 3, 2003

(65) Prior Publication Data

US 2004/0195589 A1 Oct. 7, 2004

(51) Int. Cl.[7] .............................................. H01L 29/788
(52) U.S. Cl. ..................................... 257/315; 257/390
(58) Field of Search .................................. 257/288, 296, 257/368, 930, 315, 369, 316, 390

(56) References Cited

U.S. PATENT DOCUMENTS

| | | | |
|---|---|---|---|
| 4,896,243 A | * 1/1990 | Chatterjee et al. | 361/56 |
| 5,403,764 A | 4/1995 | Yamamoto et al. | |
| 5,808,336 A | * 9/1998 | Miyawaki | 257/315 |
| 5,822,243 A | 10/1998 | Shone | |
| 6,369,416 B1 | * 4/2002 | Hui et al. | 257/288 |
| 6,492,275 B2 | * 12/2002 | Riley et al. | 438/696 |
| 2002/0191432 A1 | 12/2002 | Thomas | |

FOREIGN PATENT DOCUMENTS

| | | |
|---|---|---|
| EP | 0890985 A1 | 1/1999 |
| EP | 1089332 A2 | 4/2001 |

* cited by examiner

Primary Examiner—Long Pham
Assistant Examiner—Dana Farahani
(74) Attorney, Agent, or Firm—Winston Hsu

(57) ABSTRACT

A CMOS-compatible read only memory (ROM) includes a first single-poly PMOS transistor that is serially electrically connected to a second single-poly PMOS transistor for recording digital data "1" or digital data "0". The first and second single-poly PMOS transistors are both formed on an N-well of a P-type substrate. The first single-poly PMOS transistor includes a select gate electrically connected to a word line, a first P+ source doping region electrically connected to a source line, and a first P+ drain doping region. The second single-poly PMOS transistor includes a floating gate, a second P+ source doping region electrically connected to the first P+ drain doping region, and a second P+ drain doping region electrically connected to a bit line. The second P+ source doping region and the second P+ drain doping region define a floating gate channel region under the floating gate. A fast FPLD-to-ROM conversion method is also disclosed. After the final software code is fixed and the addresses where the memory units to be coded are determined, the FPLD are transformed into a ROM by either changing the layout of a photo mask that is used to define polysilicon gates to cancel the pre-selected floating gates according to the fixed software code, or by ion implanting the pre-selected floating gate channel regions underneath those floating gates where the memory units are to be coded.

14 Claims, 5 Drawing Sheets

CMOS-COMPATIBLE READ ONLY MEMORY AND METHOD FOR FABRICATING THE SAME

BACKGROUND OF INVENTION

1. Field of the Invention

The present invention relates to a semiconductor memory device. More particularly, the present invention relates to a semiconductor read only memory (ROM) and a method of manufacture therefor. The present invention further provides a method of directly transforming CMOS-compatible single-poly one-time programming (OTP) memory into coded non-volatile memory without the need of re-designing the peripheral circuitry, thereby reducing product cost and chip development time.

2. Description of the Prior Art

Read-only memory (ROM) semiconductor integrated circuits are widely used as memory storage devices for digital electronic equipments, in particular, microprocessor-based computer systems, to almost permanently store predetermined programs. ROMs are made on special orders with the programming code being specified by the customers. In a conventional semiconductor ROM device, the channel region of a memory cell is selectively implanted with ions to adjust the threshold voltage thereof depending on whether the programmed memory cell is turned on or turned off to represent a logic "1" or a logic "0" in binary, respectively. In the case of mask ROM, the coding of the data bits onto the memory cell transistors is generally performed by implanting ions into the channel regions of the appropriate memory cell transistors, thereby adjusting their threshold voltages. This step of coding the data into the ROM array structure through ion implantation is performed using a code mask which permits the implantation of ions into only certain regions of the semiconductor.

A ROM array consists of a large number of memory cells. Each memory cell consists of a MOS transistor having a gate, a source and a drain. The gates are parts of polysilicon strips which are the X address lines or word lines for the array. Typically, the sources are part of an N+ diffused region which is connected to ground, source lines, or Vss, while the drains are part of N+ diffused regions which are Y output lines or bit lines. To reach a maximum memory packing density, most of the prior art ROM devices use the above-described one memory cell one MOS transistor structure. Nevertheless, in some applications, it needs that a ROM cell consists of two MOS transistors.

Typically, during the development phase of a system IC, there are several steps taken prior to that the firmware or program code is fixed. First, to facilitate the debugging procedure, an external flash memory is used to store the program code. After the hardware design is completed, single chip IC design will be implemented using embedded flash processes so that the program code can be stored in the embedded flash to facilitate the debugging. Thereafter, as all the hardware and software bugs are fixed, the embedded flash will be replaced with an embedded ROM, which is known as Flash-to-ROM conversion. However, it usually takes a lot of time to implement the Flash-to-ROM conversion since the different technologies between the flash memory and ROM. For example, the peripheral circuitry must be re-designed and the back-end process such as testing has to be revised. Consequently, the prior art Flash-to-ROM conversion is expensive and time-consuming.

SUMMARY OF INVENTION

It is therefore a primary objective of this invention to provide a dual-transistor ROM structure and a method of converting dual-transistor field programmable logic devices into embedded non-volatile memory coded with fixed program code.

It is a further objective of this invention to provide a fast FPLD-to-ROM conversion method. After the final software code is fixed and the addresses where the memory units to be coded are determined, the FPLD are transformed into a ROM by either changing the layout of a photo mask that is used to define polysilicon gates to cancel the pre-selected floating gates according to the fixed software code, or by ion implanting the pre-selected floating gate channel regions underneath those floating gates where the memory units are to be coded, but without the need of re-designing peripheral circuitry or changing logic processes.

According to the claimed invention, a CMOS-compatible read only memory (ROM) includes a first single-poly PMOS transistor that is serially electrically connected to a second single-poly PMOS transistor for recording digital data "1" or digital data "0". The first and second single-poly PMOS transistors are both formed on an N-well of a P-type substrate. The first single-poly PMOS transistor includes a select gate electrically connected to a word line, a first P+ source doping region electrically connected to a source line, and a first P+ drain doping region. The second single-poly PMOS transistor includes a floating gate, a second P+ source doping region electrically connected to the first P+ drain doping region, and a second P+ drain doping region electrically connected to a bit line. The second P+ source doping region and the second P+ drain doping region define a floating gate channel region under the floating gate. According to one preferred embodiment of the present invention, P+ type dopants such as boron are implanted into the floating gate channel region in advance (before the formation of the floating gate thereon) using an additional photomask, thereby turning the second single-poly PMOS transistor into a depletion mode transistor. According to another preferred embodiment of the present invention, the layout of a photo mask (or poly mask) that is used to define polysilicon gates including word lines and floating gates is changed to cancel the pre-selected floating gates according to a fixed software code. P+ type dopants such as boron are implanted into the floating gate channel region where the pre-selected floating gates are cancelled in the step of ion implanting source/drain regions of transistors.

Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

As mentioned, most of the prior art ROM devices use one memory cell one MOS transistor structure. The present invention is directed to a method for transforming a dual-transistor single-poly ROM device for prototyping ROM code program into a final coded non-volatile memory device. It is one advantage of the present invention that for chip manufacturers they can now directly transform a dual-transistor field programmable logic device (FPLD) embedded inside an integrated circuit (IC) into coded non-volatile memory without the need of re-designing peripheral circuitry, thereby shortening product development time and saving cost.

The preferred embodiments in accordance with the present invention will be discussed in detail with reference to FIG. 1 to FIG. 5. It is understood that the type of semiconductor regions, device layout, and polarity of voltages are chosen solely for illustration, and person having ordinary skill in the art would recognize other alternatives, variations, and modifications.

Figure 1:
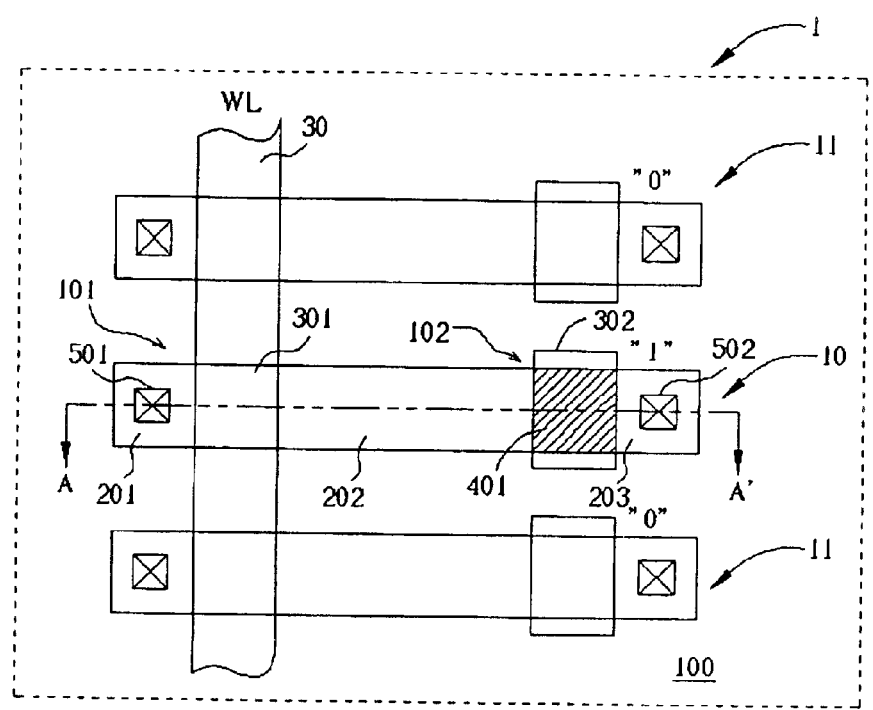
FIG. 1 is an enlarged planar view showing a portion of layout of a non-volatile memory array according to the first preferred embodiment of the present invention.

Please refer to FIG. 1. FIG. 1 is an enlarged planar view showing a portion of layout of a non-volatile memory array 1 according to the first preferred embodiment of the present invention. As shown in FIG. 1, the non-volatile memory array 1 comprises a memory unit 10 formed on an N well 100 of a P type substrate (not explicitly shown). Word lines and bit lines arranged in orthogonal manner are provided, and only one word line 30 is shown in FIG. 1. The memory unit 10 consists of two serially electrically connected single-poly PMOS transistors 101 and 102. The PMOS transistor 101 comprises a select gate 301, which is part of the word line strip 30, a P source region 201, and a P+ drain region 202. The PMOS transistor 102 comprises a single-poly floating gate 302, a P+ source 202, and a P+ drain region 203. The single-poly PMOS transistors 101 and 102 share the P+ doped region 202, which acts as the drain of the PMOS transistors 101 and the source of the PMOS transistors 102. The P+ source region 201 of the PMOS transistor 101 is electrically connected to a source line (not shown) via a contact 501 to provide the memory unit 10 with a source line voltage $V_{SL}$. The P+ drain region 203 of the PMOS transistor 102 is electrically connected to a bit line (not shown) via a contact 502 to provide the memory unit 10 with a bit line voltage $V_{BL}$.

The P+ source region 202 and the P+ drain region 203 define a floating gate channel region 401 as indicated in shadow area of FIG. 1. When the memory unit 10 is selected to permanently store logic data "1", a predetermined dosage of P+ type impurities such as boron are implanted into the floating gate channel region 401 to transform the PMOS enhancement mode transistor 102 into a depletion mode transistor. The implantation of boron may be carried out prior to the formation of the floating gate oxide. Other memory units or the non-selected memory units 11 of the memory array 1 are operated under an enhancement mode, which means that no impurity is doped into the floating gate transistors of these non-selected memory units 11, and thus these memory units 11 represent logic data "0".

Figure 2:
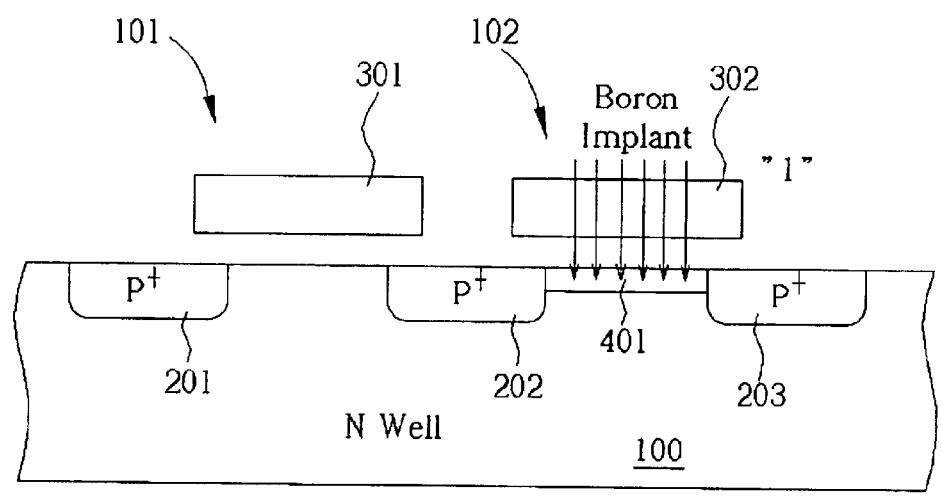
FIG. 2 is a schematic, cross-sectional diagram illustrating the non-volatile memory unit of FIG. 1 along line AA".

Please refer to FIG. 2 with reference to FIG. 1. FIG. 2 is a schematic, cross-sectional diagram illustrating the non-volatile memory unit 10 of FIG. 1 along line AA". As in FIG. 2, single-poly PMOS transistors 101 and 102 formed on the N well 100 are serially connected to each other. As mentioned, boron ions are selectively implanted into the floating gate channel regions 401 of the memory array 1 according to a fixed program code preferably prior to the formation of the floating gate oxide. The concentration of the implanted P type impurities is higher than the doping concentration of the N well 100. For example, the concentration of the implanted P type impurities is between $10^{16}$ $cm^{-3}$ and $10^{18}$ $cm^{-3}$. The implantation of boron ions may be carried out through a coding photoresist which is patterned according to a code mask. The coding photoresist has a plurality of apertures that expose the address of the floating gate transistors of the memory array that are to be coded to represent logic data "1".

Figure 3:
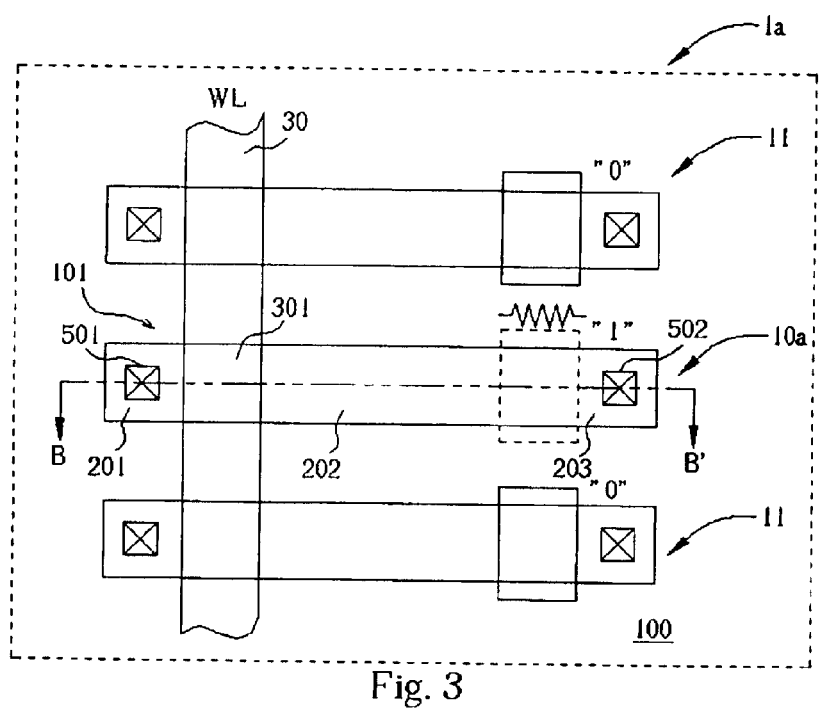
FIG. 3 is an enlarged planar view showing a portion of layout of a non-volatile memory array according to the second preferred embodiment of the present invention.

Please refer to FIG. 3. FIG. 3 is an enlarged planar view showing a portion of layout of a non-volatile memory array 1a according to the second preferred embodiment of the present invention, in which like reference numerals designate similar or corresponding elements, regions, and portions. As shown in FIG. 3, the non-volatile memory array 1a comprises a memory unit 10a formed on an N well 100 of a P type substrate (not explicitly shown). Word lines and bit lines arranged in orthogonal manner are provided, and only one word line 30 is shown in FIG. 3. As indicated, memory unit 10a is designated to store logic data "1". The memory unit 10a consists of single-poly PMOS transistor 101 comprising a select gate 301, which is part of the word line strip 30, a P+ source region 201, and a P+ drain region 202. The P+ source region 201 of the PMOS transistor 101 is electrically connected to a source line (not shown) via a contact 501 to provide the memory unit 10a with a source line voltage $V_{SL}$. The P+ drain region 202 of the PMOS transistor 101 is electrically connected to a bit line (not shown) via a contact 502 to provide the memory unit 10a with a bit line voltage $V_{BL}$. The contact 502 is formed on a P doped area 203. Compared to the first preferred embodiment, the memory unit 10, as set forth in FIG. 1, the memory unit 10a representing logic data "1" has no floating gate (indicated in dash line). The fixed ROM code is combined with the photo mask to define the gate pattern. That is, at the addresses of the memory array where the memory units represent logic data "1", the floating gates are "cancelled". After the patterning of the gates including word line gates and floating gates, source/drain implantation is carried out. The areas where the floating gate pattern is cancelled are defined as cancelled floating gate channel regions. P type impurities are directly implanted into the cancelled floating gate channel region without the shield of a floating gate. The doped area within the cancelled floating gate channel region acts as a resistor connecting the drain region 202 of the PMOS transistor 101 with the doped area 203. Likewise, other memory units or the non-selected memory units 11 of the memory array 1a are operated under an enhancement mode, which means that no source/drain impurity is doped into the floating gate channel regions of these non-selected memory units 11, and thus these memory units 111 represent logic data "0". It is noted that since the floating gates of the memory units 10a representing logic data "1" are cancelled, they are single transistor memory cell, while those memory units 11 representing logic data "0" remain as dual PMOS transistor memory cells.

Figure 4:
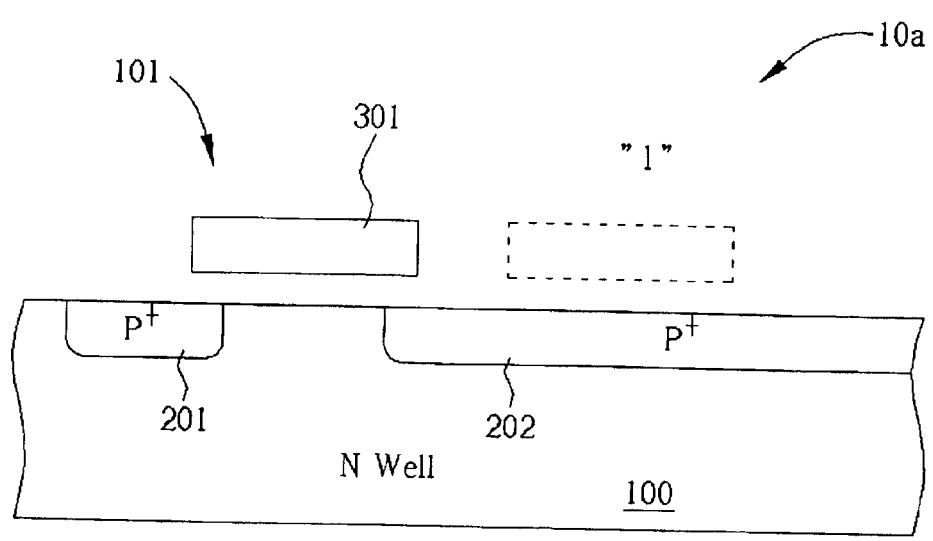
FIG. 4 is a schematic, cross-sectional diagram illustrating the non-volatile memory unit of FIG. 3 along line BB".

Please refer to FIG. 4. FIG. 4 is a schematic, cross-sectional diagram illustrating the non-volatile memory unit 10a of FIG. 3 along line BB". As shown in FIG. 4, the single-poly PMOS transistor 101 is formed on the N well 100. The difference between the memory unit 10 of FIG. 1 according to the first preferred embodiment of this invention and the memory unit 10a of FIG. 3 is that the memory unit 10a representing logic data "1" has no floating gate.

Figure 5:
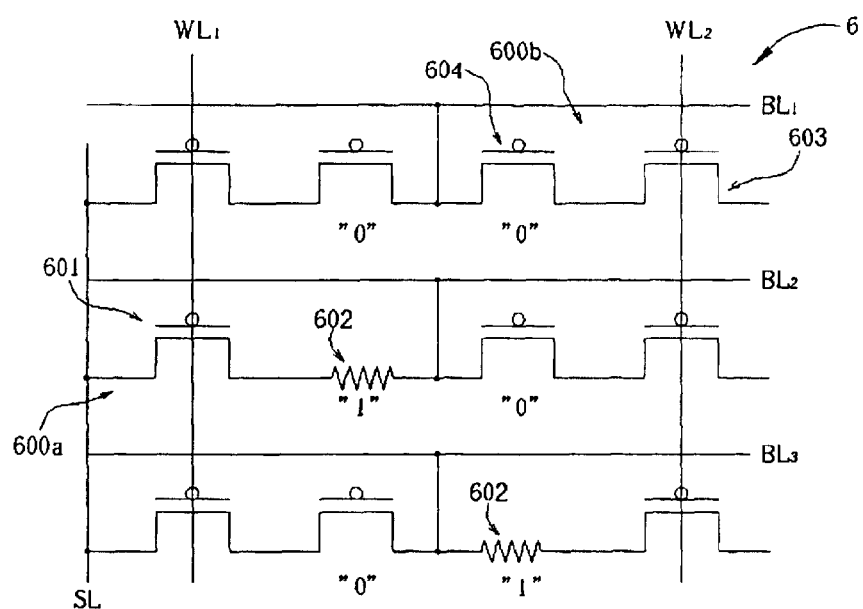
FIG. 5 is a circuit diagram illustrating a portion of the coded non-volatile memory array according to the present invention.

Please refer to FIG. 5. FIG. 5 is a circuit diagram illustrating a portion of the coded non-volatile memory array 6 according to the present invention. As shown in FIG. 5, the non-volatile memory array 6 comprises a plurality of memory units representing logic data "1", as specifically indicated at the address 600a. Each memory unit representing logic data "0" comprises a select transistor 601 having a drain electrically connected to a doped area that acts as a resistor substantially. The other memory units of the non-volatile memory array 6 are dual transistor memory units representing logic data "0", as indicated at the address 600b. Each dual transistor memory unit comprises a select transistor 603 and a floating gate transistor 604 serially connected to the select transistor 603, which are both operated under an enhancement mode. It is understood that the resistor symbols used in FIG. 5 are only illustrative. The resistors 602 may be formed by either code implanting the selected floating gate channel regions (first preferred embodiment) or code implanting cancelled floating gate channel regions (second preferred embodiment).

To sum up, the present invention provides a fast FPLD-to-ROM conversion method for shortening chip development time and reducing manufacturing cost. The program code is permanently stored in the FPLD using threshold voltage ion implant to transform selected transistors into depletion mode transistors. In practice, the fast FPLD-to-ROM conversion method according to the present invention includes the following steps: (1) forming FPLD using logic processes; (2) performing software/firmware code debugging; (3) fixing the software code which is bug free; and (4) determining the addresses where the FPLD to be coded according to the final software code. It is an advantage of the present invention that since embedded ROM are converted from FPLD, it is no need to change logic processes of making such embedded chip and backend testing processes. In contrast to the prior art, the present invention provides a dual transistor FPLD based ROM by either simply changing the photo mask layout for defining polysilicon gates to cancel selected floating gates or ion implanting the selected floating gate transistors using an additional ROM code mask.

Those skilled in the art will readily observe that numerous modifications and alterations of the device and method thereof may be made while retaining the teachings of the invention. Accordingly, the above disclosure should be construed as limited only by the metes and bounds of the appended claims.

What is claimed is:

1. A read only memory (ROM) cell unit comprising:
   a P type substrate;
   an N well disposed in the P type substrate;
   non-stacked gate electrode PMOS select transistor formed on the N well, the non-stacked gate electrode PMOS select transistor comprising select gate electrically connected to a word line, a first P+ source doping region electrically connected to a source line, and a first P+ drain doping region; and
   a non-stacked gate electrode PMOS floating gate transistor formed on the N wall and serially electrically connected to the non-stacked gate electrode PMOS select transistor, the non-stacked gate electrode PMOS floating gate transistor comprising a floating gate, a second P+ source doping region electrically connected to the first P+ drain doping region, and a second P+ drain doping region electrically connected to a bit line, wherein the second P+ source doping region and the second P+ source doping region define a floating gate channel;
   wherein P type impurities are implanted into the floating gate P channel, thereby turning the non-stacked gate electrode PMOS floating gate transistor into a depletion mode transistor for storing logic data "1".

2. The ROM cell unit of claim 1 wherein the floating gate P channel is doped to a concentration of between $10^{16}$–$10^{18}$ cm$^{-3}$.

3. The ROM cell unit of claim 1 wherein the second P+ source doping region and the first P+ drain doping region are merged into a contiguous region.

4. The ROM cell unit of claim 1 wherein the P type impurities are boron ions.

5. A read only memory (ROM) cell unit comprising:
   a non-stacked gate electrode MOS select transistor comprising a select gate electrically connected to a word line, a first source doping region electrically connected to a source line, and a first drain doping region; and
   a non-staked gate electrode MOS floating gate transistor serially electrically connected to the non-stacked gate electrode MOS select transistor, the non-stacked gate electrode MOS floating gate transistor comprising a floating gate, a second source doping region electrically connected to the first drain doping region, and a second drain doping region electrically connected to a bit line, wherein the second source doping region and the second source doping region define a floating gate channel.

6. The ROM cell unit of claim 5 is a mask ROM.

7. The ROM cell unit of claim 5 wherein impurities are implanted into the floating gate channel, thereby turning the non-stacked gate electrode MOS floating gate transistor into a depletion mode transistor for storing digital data "1".

8. The ROM cell unit of claim 7 wherein the floating gate channel is doped to a concentration of between $10^{16}$–$10^{18}$ cm$^{-3}$.

9. The ROM cell unit of claim 5 wherein the non-stacked gate electrode MOS select transistor and the non-stacked gate electrode MOS floating gate transistor are both single-poly PMOS transistors.

10. The ROM cell unit of claim 5 wherein the second source doping region and the first drain doping region are merged into a contiguous region.

11. A read only memory (ROM) coded with binary code, the ROM comprising:
   an array of field programmable logic devices (FPLDs) comprising a plurality of non-stacked date electrode MOS select transistors in one column, each of the non-stacked gate electrode MOS select transistor comprising a select gate electrically connected to a word line, a first source doping region electrically connected to a source line, and a first drain doping region;
   a non-stacked gate electrode MOS floating gate transistor serially electrically connected to the corresponding non-stacked gate electrode MOS select transistor in the column at an address for storing logic data "0", the non-stacked gate electrode MOS floating gate transistor comprising a floating gate, a second source doping region electrically connected to the first drain doping region, and a second drain doping region electrically connected to a bit line; and
   a resistor electrically connected the first drain doping, region of the corresponding MOS select transistor in the column at an address for storing logic data "1" with the bit line.

12. The ROM of claim 11 wherein the resistor is an ion doping region connecting the first drain doping region of the corresponding non-stacked gate electrode MOS select transistor in the column at an address for storing logic data "1" with the bit line, and wherein the ion doping region has the same polarity as the polarity of the first source doping region and the polarity of the first drain doping region.

13. A read only memory (ROM) coded with binary code, the ROM comprising:

- an array of field programmable logic devices (FPLDs) comprising a plurality of non stacked gate electrode PMOS select transistors in one column, each of the non-stacked gate electrode PMOS select transistor comprising a select gate electrically connected to a word line, a first P+ source doping region electrically, connected to a source line, and a first P+ drain doping region;
- a non-stacked gate electrode PMOS floating gate transistor serially electrically connected to the corresponding non-stacked gate electrode PMOS select transistor in the column at an address for storing logic data "0", the non-stacked gate electrode PMOS floating gate transistor comprising a single-poly floating gate, a second P+ source, doping region electrically connected to the first P+ drain doping region, and second P+ drain doping region electrically connected to a bit line; and
- a P doping region formed in a cancelled floating gate channel region at an address for storing logic data "1", the P doping region acting as a resistor electrically connected the first P drain doping region of the corresponding non-stacked gate electrode PMOS select transistor of the column at the address for storing logic data "1" with the bit line, wherein there is no floating gate above the P doping region.

14. The read only memory (ROM) coded with binary code of claim 13 wherein the second source P+ doping region and the first P+ drain doping region are merged into a contiguous region.

* * * * *